United States Patent
Takahashi et al.

(10) Patent No.: US 7,100,136 B2
(45) Date of Patent: *Aug. 29, 2006

(54) LSI DESIGN SYSTEM

(75) Inventors: Miwaka Takahashi, Kyoto (JP); Masahiko Toyonaga, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/183,592

(22) Filed: Jun. 28, 2002

(65) Prior Publication Data

US 2002/0162080 A1    Oct. 31, 2002

Related U.S. Application Data

(63) Continuation of application No. 09/447,807, filed on Nov. 23, 1999, now Pat. No. 6,415,423.

(30) Foreign Application Priority Data

Nov. 30, 1998    (JP)    ............................ P10-339448

(51) Int. Cl.
*G06F 17/50*    (2006.01)

(52) U.S. Cl. .................. 716/6; 716/10; 716/11; 716/12

(58) Field of Classification Search ............... 716/6–8, 716/10–14, 5
See application file for complete search history.

(56) References Cited

U.S. PATENT DOCUMENTS

| | | | |
|---|---|---|---|
| 4,593,362 A * | 6/1986 | Bergeron et al. | 716/14 |
| 4,882,764 A * | 11/1989 | Reynolds et al. | 382/112 |
| 4,912,684 A * | 3/1990 | Fowler | 367/76 |
| 5,105,293 A * | 4/1992 | Bortolini | 398/141 |
| 5,375,069 A * | 12/1994 | Satoh et al. | 716/14 |
| 5,598,348 A | 1/1997 | Rusu et al. | |
| 5,618,744 A * | 4/1997 | Suzuki et al. | 716/1 |
| 5,697,088 A * | 12/1997 | Gu | 455/307 |
| 5,751,597 A | 5/1998 | Okano et al. | |
| 5,774,371 A * | 6/1998 | Kawakami | 716/10 |
| 5,878,053 A * | 3/1999 | Koh et al. | 371/22.1 |
| 5,933,358 A * | 8/1999 | Koh et al. | 703/14 |
| 5,943,487 A * | 8/1999 | Messerman et al. | 716/11 |
| 6,035,108 A * | 3/2000 | Kikuchi | 716/12 |
| 6,035,111 A * | 3/2000 | Suzuki et al. | 716/11 |
| 6,058,256 A * | 5/2000 | Mellen et al. | 716/12 |
| 6,077,309 A * | 6/2000 | Lin | 716/14 |
| 6,112,157 A * | 8/2000 | Boon et al. | 702/58 |
| 6,185,722 B1 * | 2/2001 | Darden et al. | 716/5 |
| 6,353,917 B1 * | 3/2002 | Muddu et al. | 716/6 |
| 6,405,350 B1 * | 6/2002 | Tawada | 716/5 |
| 6,457,157 B1 * | 9/2002 | Singh et al. | 716/10 |

(Continued)

FOREIGN PATENT DOCUMENTS

JP    05126872 A    5/1993

(Continued)

*Primary Examiner*—Paul Dinh
(74) *Attorney, Agent, or Firm*—Jacobson Holman PLLC (57) ABSTRACT

Based on a relative comparison of respective consumed powers of cells which are subjected to a layout, separation information on cells to be separated which are to be arranged in a spaced-apart manner from each other is generated by separation information generating means, and a layout is generated by layout generating means based on this separation information. Accordingly, it is no more necessary to rearrange cells or to form a layout of the entire circuit again after generating an initial layout. Furthermore, it is no more necessary to set wide spacing between wirings. Still furthermore, the occurrence of noise is prevented.

16 Claims, 8 Drawing Sheets

U.S. PATENT DOCUMENTS

6,591,091 B1 * 7/2003 Vorenkamp et al. ..... 455/179.1
6,704,560 B1 * 3/2004 Balteanu et al. ............ 455/333

FOREIGN PATENT DOCUMENTS

| JP | 08194729 A | 7/1996 |
| JP | 09269958 A | 10/1997 |
| JP | 10-21289 | 1/1998 |
| JP | 10163325 A | 6/1998 |
| JP | 10-321729 | 12/1998 |
| JP | 11238802 A | 8/1999 |
| JP | 11261041 A | 9/1999 |

* cited by examiner

F I G. 1

F I G. 2

| instance name | consumed power |
|---|---|
| A | 0.5 |
| B | 0.5 |
| C | 0.3 |
| D | 0.3 |
| E | 0.1 |
| F | 0.1 |
| G | 0.1 |
| H | 0.1 |
| I | 0.1 |
| J | 0.1 |
| K | 0.1 |
| L | 0.1 |
| cell sum | 2.4 |
| cell average | 0.2 |

F I G. 3 separateCell A,B,C,D

FIG. 4

FIG. 5 separateCell A,B 10
separateCell A,C 8
separateCell A,D 8
separateCell B,C 8
separateCell B,D 8
separateCell C,D 6

| time zone | t1 | t2 | t3 | t4 | t5 | t6 |
|---|---|---|---|---|---|---|
| time combined value | 40 | 15 | 15 | 10 | 30 | 55 |
| A | 10 | 10 | | | | 30 |
| B | 10 | | 10 | | 15 | 15 |
| C | 10 | | | 5 | 5 | 10 |
| D | 10 | 5 | 5 | 5 | 5 | |

FIG. 9 separateCell A,B  45

F I G. 10

F I G. 11

```
                    C 0.3      D 0.3
                    G 0.1      J 0.1
A 0.5     B 0.5     H 0.1      K 0.1
E 0.1     F 0.1     I 0.1      L 0.1
─────────────────────────────────────
 0.6       0.6       0.6        0.6
```

F I G. 12 group A,E
group B,F
group C,G,H,I
group D,J,K,L

F I G. 13

F I G. 14

F I G. 15 separateNet N1,N3

F I G. 16

F I G. 17

F I G. 18

F I G. 19

N1 1
N2 1
N3 1
N4 12
N5 32
N6 16
N7 8
N8 2

F I G. 20 separateNet N5,N6,N7

F I G. 21

F I G. 22 separateNet N4,N5 44
separateNet N4,N6 28
separateNet N5,N6 48

FIG. 23

PRIOR ART

LSI DESIGN SYSTEM

CROSS-REFERENCE TO RELATED APPLICATIONS

The present patent application is a continuation of application Ser. No. 09/447,807, filed Nov. 23, 1999, now U.S. Pat. No. 6,415,423.

BACKGROUND OF THE INVENTION

1. Field of the Invention

This invention relates to an improvement of an LSI design system using a computer, and more particularly to an LSI design system which is capable of preventing the occurrence of voltage drop and noise which are caused by the concentration of cells or wirings.

2. Description of the Related Arts

Recently, along with the advancement of the fine processing technology, the high integration of the LSI has been progressed and hence, the demand for further speedup or further lowering of voltages of an LSI and the demand for the development of an LSI in a short period are increasing.

In designing the densely packed cells and wirings, voltage drop and noise occur due to the partial concentration of consumed power and this causes the malfunction of the LSI and lowering of the yield. This is caused by a following reason. That is, the voltage drop occurs in case the consumed power of the cells connected to power trunks is relatively large compared to the power supplied to the power trunks. When the voltage drop occurs, there arises a problem that driving of cells connected to the power trunks requires a long time or cells become inoperable. On the other hand, noise occurs in the following manner. That is, when signals are changed approximately in the identical timing at a plurality of neighboring wirings, a capacitance constructed between wires mediates unexpected signal as noise. This noise causes the delay or rashness of the signal.

Figure 23:
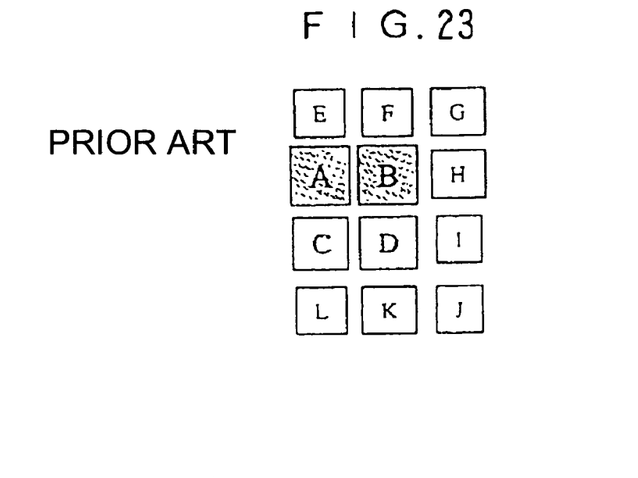
FIG. 23 is an explanatory view illustrating a layout generated by a conventional LSI design system.

As illustrated in FIG. 23, when a plurality of cells having a large consumed power, for example, cells which are given instance names A–D are arranged in such a manner that they are concentrated at one place, voltage drop occurs thus giving rise to a malfunction of a circuit.

Figure 24:
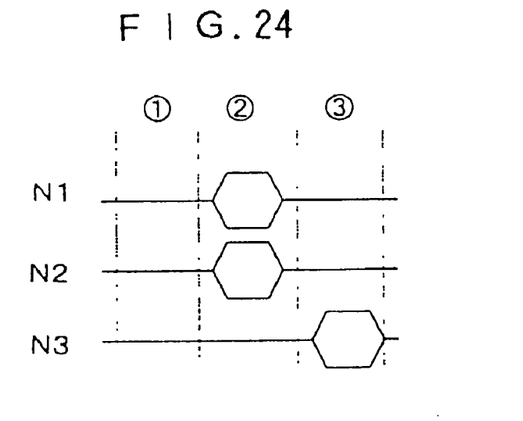
FIG. 24 is an explanatory view illustrating the signal change condition of wirings.
Figure 25:
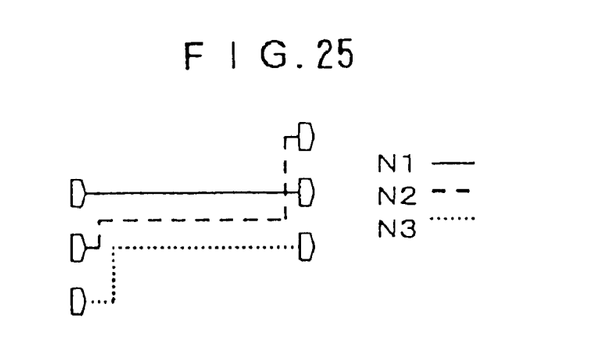
FIG. 25 is an explanatory view illustrating the generated layout.

Conventionally, the layout of wirings has been designed in such a manner that the wirings are arranged without taking change of signals into account. With respect to three wirings N1, N2, N3 illustrated in FIG. 24 which generate change of signals, when two wirings N1, N2 which generate change of signals in the identical timing are arranged close to each other as shown in FIG. 25, noise occurs thus giving rise to a malfunction of the circuit.

Conventionally, based on information on an arrangement of cells and wirings obtained after designing the layout, in case voltage drop is greater than the minimum operating voltage, the cells which are subjected to such a voltage drop are rearranged so as to ensure the minimum operating voltage thus preventing the voltage drop. One example of such method has been disclosed in Japanese laid-open patent publication Hei 9-130622, the U.S. Pat. No. 5,598,348 and the U.S. Pat. No. 5,751,957.

Furthermore, considering the necessity of preventing the occurrence of noise, with respect to wirings which are arranged in parallel to each other, it has been recommended to set a wide spacing between wirings from the beginning.

The rearrangement of cells after completion of the designing of the layout requires considerable efforts and time. Furthermore, in case the rearrangement of cells turns out to be insufficient to prevent voltage drop, the layout of the entire circuit must be designed again. Such a redesigning of the layout prolongs the development period of the LSI.

Setting of the wide spacing or distance between wirings from the beginning to obviate such troubles, on the other hand, increases the area of the LSI, gives rise to an increase of cost and makes the high integration of the LSI difficult.

SUMMARY OF THE INVENTION

Accordingly, it is a primary object of the present invention to provide an LSI design system which can prevent voltage drop without necessitating rearranging of cells after designing of a layout, redesigning of an entire circuit, or setting of a wide spacing between wirings.

It is another object of the present invention to provide an LSI design system which can prevent the occurrence of noise without necessitating rearranging of cells after designing of a layout, redesigning of an entire circuit, or setting of a wide spacing between wirings.

To achieve the above objects, the LSI design system of the present invention is constructed by including separation information generating means which generates information on cells to be separated which require a separate arrangement from each other based on the relative comparison of respective consumed powers of cells which are subjected to a layout, and layout generating means which generates a layout based on the information.

The cells to be separated which have to be arranged in a spaced-apart manner are arranged in a spaced-apart manner from the beginning of an layout based on the information of the separation information generating means.

BRIEF DESCRIPTION OF THE DRAWING

The other objects of the present invention will be made clear as embodiments which will be explained hereinafter are understood, and they are explicitly described in attached claims. Furthermore, many other advantages which will not be discussed in this specification will be readily understood by those who are skilled in the art once the present invention is reduced into practice.

DESCRIPTION OF THE PREFERRED EMBODIMENT

Preferred embodiments of this invention are explained in detail in conjunction with attached drawings.

Figure 1:
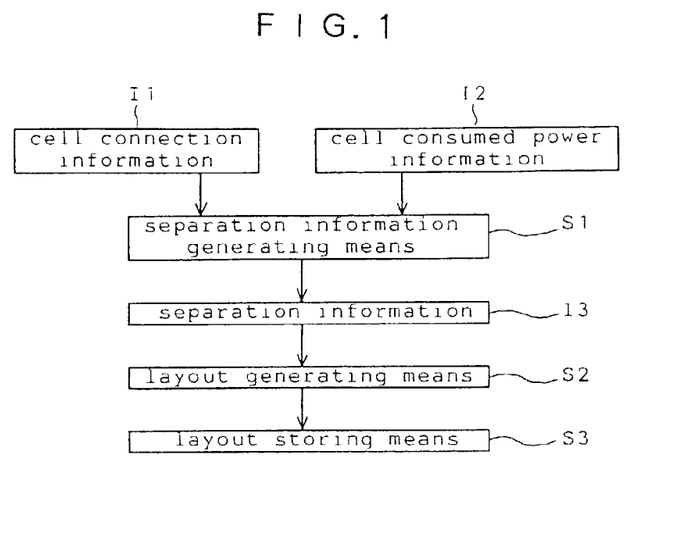
FIG. 1 is an explanatory view illustrating an LSI designing system according to the first preferred embodiment of the present invention.

An LSI design system according to the first preferred embodiment of the present invention, as illustrated in FIG. 1, includes separation information generating means S1, layout generating means S2 and layout storing means S3. The separation information generating means S1 generates separation information I3 from cell connection information I1 and cell consumed power information I2 which is contained in the cell consumed power information I1. The cell consumed power information I2 is mainly composed of consumed powers of respective cells. Here, as the consumed power, the dynamic consumed power is used, for example. The separation information I3 is information on a pair of separate cells, that is, a pair of cells which are to be arranged separately or in a spaced-apart manner at the time of generating a layout. The layout generating means S2 constitutes means which generates the layout based on the separation information I3. The layout storing means S3 stores the layout generated by the layout generating means S2. Although not shown in drawings, a display unit which displays the generated layout may preferably be provided. Furthermore, in case the generated layout is outputted and stored in an external storing device, the layout storing means S3 is not necessary specifically.

In this LSI design system, when the cell connection information I1 and the cell consumed power information I2 are inputted, the separation information generating means S1 generates the separation information I3. Then, the layout generating means S2 generates the layout in which a pair of separate cells which constitute the separation information I3 are arranged separately or in a spaced-apart manner. The generated layout is stored in the layout storing means S3.

Figure 2:
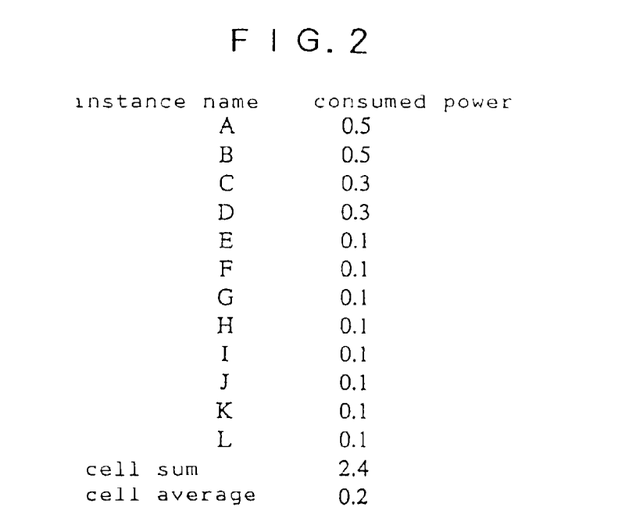
FIG. 2 is an explanatory view illustrating the content of cell connection information and cell consumed power information.
Figure 3:
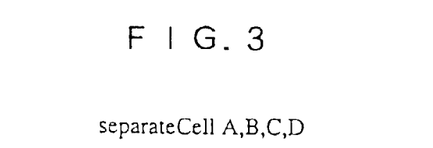
FIG. 3 is an explanatory view illustrating the content of separation information.
Figure 4:
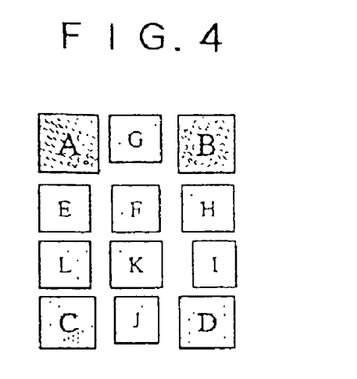
FIG. 4 is an explanatory view illustrating the arrangement condition of cells which constitutes a generated layout.

Here, the manner of generating the layout is specifically explained in view of FIG. 2–FIG. 4.

The cell connection information I1 and the cell consumed power information I2 are respectively composed of twelve cells which are given instance names A–L respectively as shown in FIG. 2, for example. The average of the consumed powers of these cells (hereinafter called as cell average) is 0.2. The cells which have the consumed power larger than the cell average 0.2 are four cells made of four cells A, B, C and D.

When the cell connection information I1 and the cell consumed power information I2 are inputted, the separation information generating means S1 extracts the cells A, B, C and D which have the consumed power larger than the cell average as cells to be separated, wherein the cell average of 0.2 is set as a threshold value. Then, as shown in FIG. 3, the separation information generating means S1 generates separation information I3 in which combinations (A,B), (A,C), (A,D), (B,C), (B,D), (C,D) are prepared by takes out an arbitrary pair from cells A, B, C, D to be separated and these combinations are generated as pairs of separate cells. These pairs of separate cells are generated on all possible combinations made of cells to be separated. It is judged that cells to be separated are not present in case the extracted cell to be separated is one.

Based on the separation information I3, the layout generating means S2 generates the layout where respective pairs of separate cells are arranged separately or in a spaced-apart manner from each other. To be more specific, the layout is generated in such a manner that between cells to be separated, at least one of cells E–L which are not cells to be separated is arranged. Due to such a construction, in each pair of separate cells, the cells to be separated which constitute each pair of separate cells are arranged in a spaced-apart manner from each other. An example of such a layout is shown in FIG. 4.

According to this LSI design system, an arrangement that cells A, B, C, D to be separated which respectively have a large consumed power are arranged in a concentrated manner at a part can be obviated. Eventually, voltage drop which is caused by the uneven distribution of parts which have a large consumed power can be prevented. Furthermore, the layout which can prevent the voltage drop can be set at the time of generating an initial layout. Accordingly, an LSI which ensures a reliable operation thereof can be developed in a short period. Furthermore, the malfunction of an LSI or lowering of the yield can be suppressed preliminarily.

An example of this LSI design system is not limited to the above-mentioned construction and the LSI design system can adopts following constructions of modifications 1–3.

Modification 1 is characterized by altering a portion of the separation information generating means S1. In this modification 1, the separation information generating means S1 generates the separation information I3 in the following manner.

Based on the consumed power information, the consumed power of each cell A–L and the sum of consumed powers of respective cells A–L (hereinafter called as 'cell sum') are compared. In case the ratio of consumed power of each cell A, B, C, D relative to the cell sum exceeds a preset threshold value (for example, 10%), these cells are determined as cells to be separated. Pairs of separate cells which are made of combinations of these cells to be separated are extracted and the separation information I3 made of these pairs of separate cells is generated.

In the modification 1, although the threshold value for extracting pairs of separate cells is set to 10% of the cell sum as an example, this threshold value is not necessarily 10% and can be set to any arbitrary value. From the experience, it has been found that it is proper to set the threshold value within a range of 1%–10% of the cell sum.

Modification 2 is also characterized by altering a portion of the separation information generating means S1. In this modification 2, along with the alteration of the separation information generating means S1, the separation information I3 and the layout generating means S2 are also altered partially. This separation information generating means S1 generates the separation information I3 in the following manner.

This separation information generating means S1 sets the above-mentioned cell average 0.2 as a threshold value and the cell A, B, C, D whose consumed power exceeds the cell average is determined as the cell to be separated and the combinations of cells A, B, C, D to be separated are extracted as pairs of separate cells.

Figure 5:
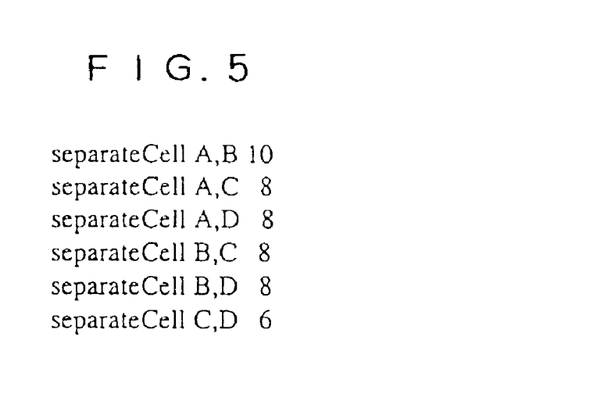
FIG. 5 is an explanatory view illustrating the content of separation information according to a modification 2.

In the example of FIG. 2 in which four cells A, B, C, D to be separated are extracted, the pairs of separate cells are constituted by (A,B), (A,C), (A,D), (B,C), (B,D), (C,D) as shown in FIG. 5.

On each pair of separate cells, a combined value of consumed power (hereinafter called as 'pair combined value') is calculated and a separation distance which is directly proportional to the pair combined value is set as separation distance information of this pair of separate cells. The separation information generating means S1 uses the calculated pair of separate cells and the separation distance information as the separation information I3.

For example, in case of the pair of separation cells (A,B), since the consumed power of the cell A is 0.5 and the consumed power of the cell B is 0.5, the pair combined value becomes 0.5+0.5=1.0. The separation distance information is calculated by multiplying the pair combined value with a coefficient N greater than 0, for example. In FIG. 5, as an example, by setting the coefficient N to 10, the separation distance information of 10.0 is calculated.

Figure 6:
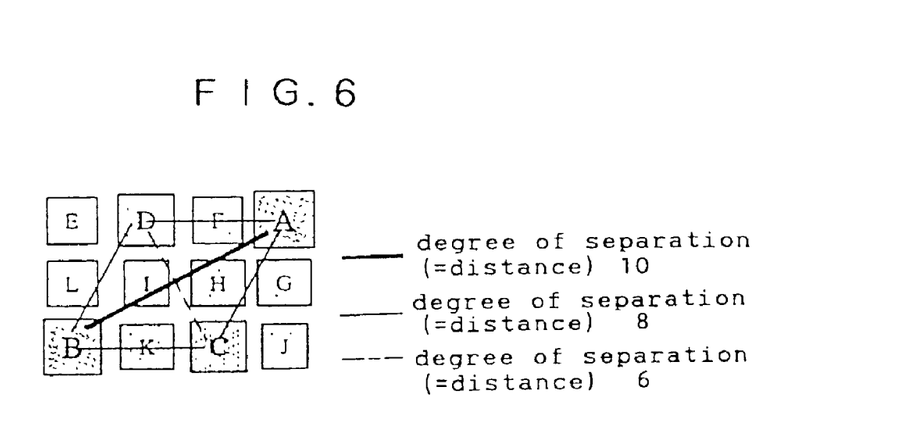
FIG. 6 is an explanatory view showing a layout according to the modification 2.

As shown in FIG. 6, the layout generating means S2 generates a layout in such a manner that respective pairs of separate cells which are defined by the separation information I3 are arranged remoter than the separation distance information. The distance unit which the separation distance information indicates can be set to various values.

It is also possible to combine the modification 1 with the modification 2. In this case, the separation information generating means S1 extracts the cells whose ratio of consumed power relative to the cell sum exceeds a given threshold value (10%, for example) as the cells to be separated. Thereafter, the separation distance information of the pairs of separate cells is calculated in the same manner as the modification 2.

Modification 3 is also characterized by the separation information generating means S1 having a portion thereof modified. This separation information generating means S1 generates the separation information I3 in the following manner.

First of all, in every time zone defined by a given time interval, a time zone consumed power of each cell (hereinafter called as 'time zone cell consumed power') and a combined value of time zone consumed powers of all cells (hereinafter called as 'time zone combined value') are calculated. Furthermore, the average of the calculated time zone consumed powers of respective cells (hereinafter called as cell time zone average) and the average of time zone combined values (hereinafter called as 'combined value time zone average') are obtained.

Then, the time zone whose time zone combined value is larger than the combined value time zone average is extracted as an object time zone. The time zone cell consumed powers of respective cells and the cell time zone average in each extracted object time zone are compared and it is judged whether a plurality of cells which have the time zone cell consumed power greater than the cell time zone average are present within one object time zone or not. If one or no such cell is present, it is judged that the cell to be separated is not present. On the other hand, if a plurality of these cells are present, a pair of cells to be separated are extracted from these cells so as to generate a pair of separate cells. A pair of separate cells is generated with respect to all pairs of cells which can be set. A pair of separate cells are generated with respect to all object time zones.

On each pair of separate cells as determined, the time zone pair combined value is calculated and distance information which is directly proportional to the time zone pair combined value is set as the separation distance information of the object time zone. Setting of the separation distance information is performed in the same manner as in the case of the modification 2. In the modification 3, the separation information I3 is composed of the separation distance information and the pairs of separate cells.

In case the same pair of separate cells is present in different object time zones, the separation distance information having the larger value is chosen as the separation distance information of the pair of separate cells.

Figure 7:
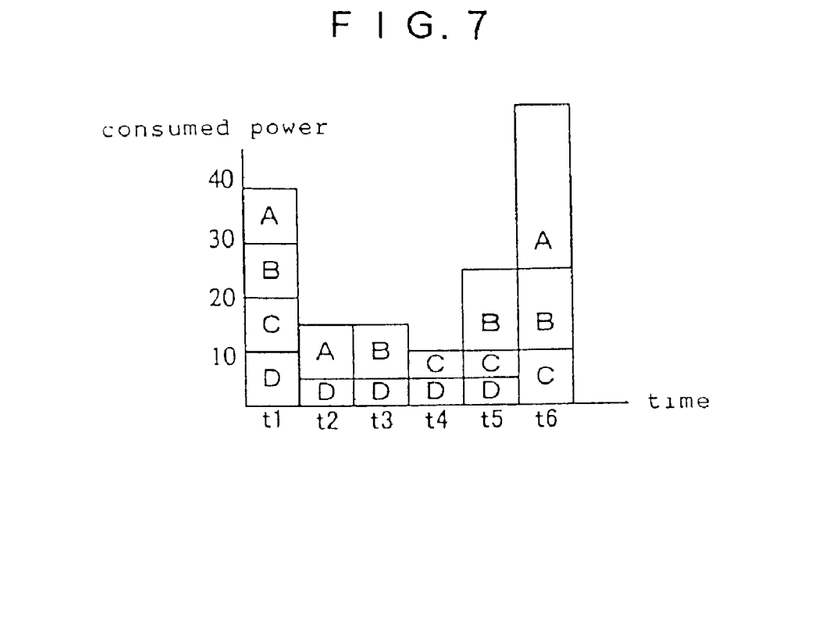
FIG. 7 is an explanatory view illustrating the consumed power of every interval according to a modification 3.

The manner of generating the separation information according to the modification 3 is specifically explained in view of FIG. 7. In FIG. 7, the cells E–L which have small time zone cell consumed powers and accordingly give little influence to generating of the layout are omitted from the drawing.

In every time zone t1–t6 which is set to an arbitrary time interval, the time zone combined value is calculated. The time zone cell consumed power of each cell A–D of every time zone t1–t6 is calculated. In FIG. 7, time is taken on abscissa and the consumed power is taken on ordinate. Symbols A–D show the instance name of the cells.

Figure 8:
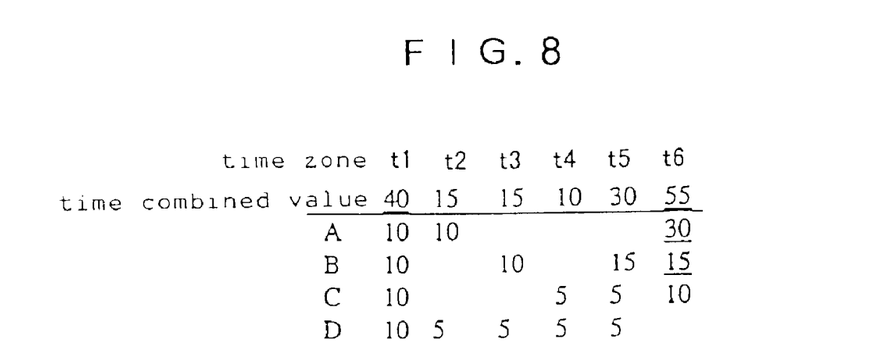
FIG. 8 is an explanatory view illustrating numerical examples of the consumed power of every time zone.

Calculated time zone cell consumed power and calculated time zone combined value are put in order and are shown as a graph in FIG. 8. The time zone combined value is 40 in the time zone t1, 15 in the time zones t2 and t3, 10 in the time zone t4, 30 in the time zone t5 and 55 in the time zone t6. The combined value time zone average is 27.5, while the cell time zone average is 10.3.

The time zones t1, t5, t6 which have the time zone combined value greater than the combined value time zone average 27.5 are extracted as object time zones. Among the object time zones t1, t5, t6, the time zone t6 in which a plurality of cells whose time zone cell consumed power exceeds the cell time zone average 10.3 are present is set as the final object time zone. In this object time zone t6, the cells to be separated are A and B, while a pair of separate cells is (A,B).

The time zone pair combined value of the pair of separate cells (A,B) at the object time zone t6 is 45 and the separation distance information is obtained by multiplying the coefficient N to this time zone pair combined value. In the construction of the modification 3, the separation distance information is calculated based on the time zone pair combined value and hence, it is unnecessary to set the large coefficient N and it is proper to set the coefficient to 1. In this case, the separation distance information becomes 45.

Figure 9:
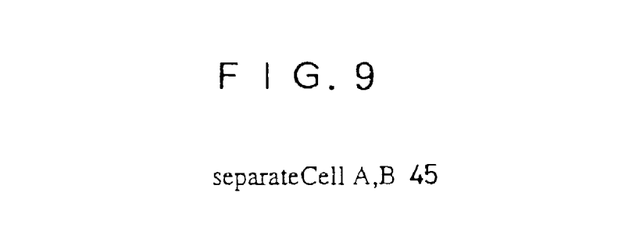
FIG. 9 is an explanatory view illustrating the content of separation information according to the modification 3.

The separation information I3 of the modification 3 is composed of a pair of separate cells (A,B) and the separation distance information. The separation information I3 of the modification 3 is shown in FIG. 9.

As explained above, in this modification 3, the time zones whose time zone combined value is greater than the combined value time zone average are set as the object time zones and among the object time zones, the combination of cells whose time zone cell consumed power is greater than the cell time zone average is set as a pair of separate cells. The present invention, however, is not limited to such a construction. That is, the time zone combined values of every time zone are calculated and these time zone combined values are summed in all time zones, and the time zones whose ratio of time zone combined value relative to the sum exceeds a given threshold value may be extracted as the object time zones. In this case, from the experience, it has been found that such a given threshold value should preferably be 1–10%.

Among extracted object time zones, the cells whose ratio of time zone cell consumed power relative to the above-mentioned cell sum exceeds a given threshold value is determined as the cells to be separated and the combination of these cells to be separated is extracted as a pair of separate cells. In this case, from the experience, it has been found that such a given threshold value should preferably be 1–10%. The separation information I3 is generated by setting the pair combined value of the extracted pair of separate cells as the separation distance information of the object interval.

Figure 10:
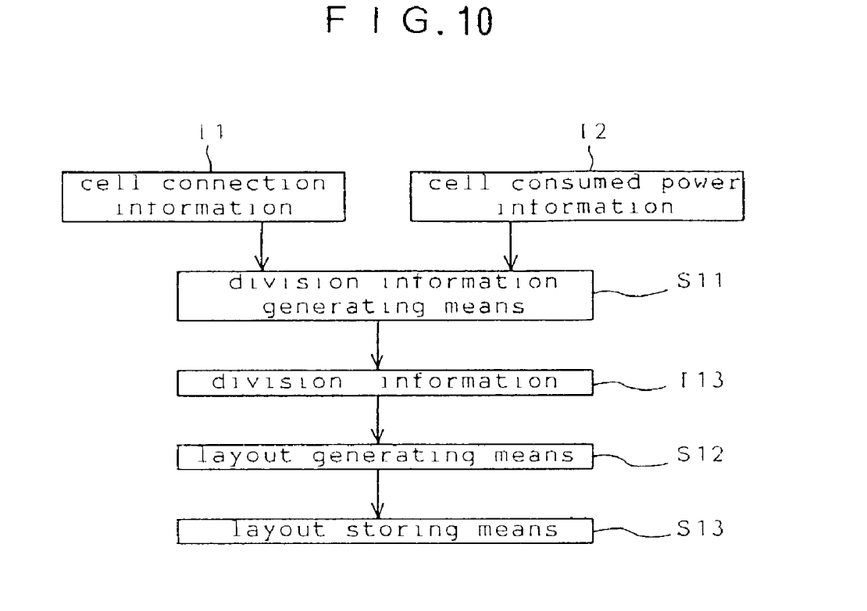
FIG. 10 is an explanatory view explaining an LSI design system according to the second preferred embodiment of the present invention.

Subsequently, the LSI design system according to the second preferred embodiment of the present invention is explained hereinafter. As illustrated in FIG. 10, this LSI design system includes division information generating means S11, layout generating means S12 and layout storing means S13.

The division information generating means S11 generates cell division information I13 from cell connection information I1 and cell consumed power information I2 contained in the cell connection information I1 at the time of generating a layout. Layout generating means S12 generates the layout based on the division information I13 generated by the division information generating means S11. Layout storing means S13 stores the generated layout.

In this LSI design system, first of all, the number of division of the whole cells is set. Then, an evaluation function is calculated by dividing the cell sum explained in the embodiment 1 with the number of division. The evaluation function has a following meaning. That is, assuming that the whole cells are divided by the set number of division, the evaluation function means the average of the combined value of consumed powers of respective cell groups which are grouped by such a division. The cell groups are hereinafter simply called as groups, while the combined value of consumed powers of each cell group is called as the group combined value.

Based on the calculated evaluation function, the whole cells are divided by the above-mentioned number of division so as to generate respective groups. Here, cells which constitute each group is selected such that the group combined value of each group agrees with the evaluation function as exactly as possible. Accordingly, there is no possibility that the consumed power of each group unit is increased in a protruding manner partially so that the group combined value is equalized among groups.

The division information I13 which is composed of the above-mentioned group division information of cells is generated by the execution of the division information generating means S11. The layout generating means S12 arranges respective cells of every group based on the division information I13.

The manner of operation of this example is specifically explained hereinafter. Here, the content of the cell connection information I1 and the cell consumed power information I2 are similar to those of counterparts shown in FIG. 2 and the explanation is made provided that these cells are grouped into four groups.

Figure 11:
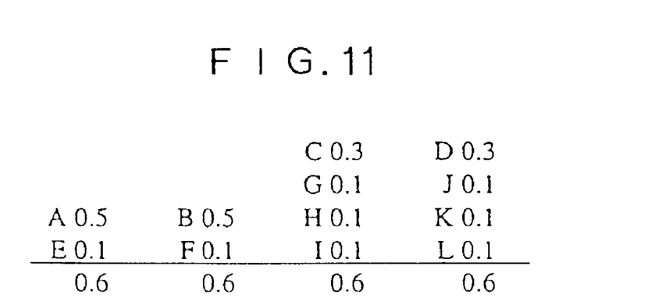
FIG. 11 is an explanatory view illustrating grouped cells for separation.
Figure 12:
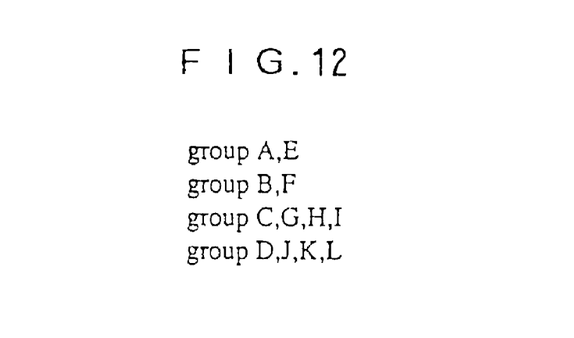
FIG. 12 is an explanatory view illustrating the content of separation information.

The evaluation function which equalizes the cell sum 2.4 in four is 0.6. Then, the division information generating means S11 to which the cell connection information I1 and the cell consumed power information I2 are inputted divides respective cells into respective groups illustrated in FIG. 11 based on the evaluation function 0.6. By dividing cells into respective groups, the division information I13 illustrated in FIG. 12 is generated.

Figure 13:
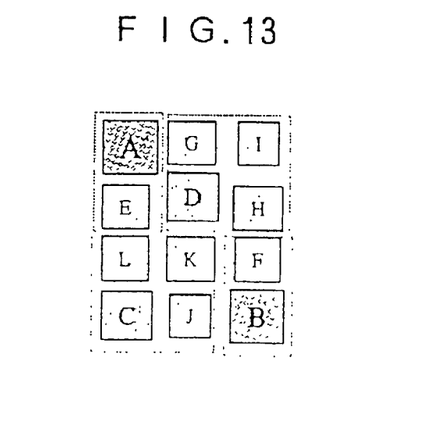
FIG. 13 is an explanatory view illustrating a cell arrangement which constitutes a generated layout.

The layout generating means S12 generates a layout illustrated in FIG. 13 based on the division information I13. As a result, the layout where cells are divided into a plurality of groups which consume substantially equal power is obtained.

According to the LSI design system of this embodiment, as in the case of the first embodiment, the concentrated arrangement of cells having large consumed powers can be obviated and hence, voltage drop caused by the uneven distribution of the parts having large power consumption can be prevented. Furthermore, the layout which can prevent voltage drop can be generated at the time of generating an initial layout. Accordingly, the LSI which ensures a reliable operation thereof can be developed in a short period. Furthermore, a malfunction of the LSI and lowering of the yield can be suppressed in advance.

Subsequently, the LSI design system of the third preferred embodiment of the present invention is explained hereinafter. The LSI design system of this embodiment is characterized in that information on wirings which are to be arranged separately or in a spaced-apart manner is generated and based on the information, the wiring are arranged separately.

Figure 14:
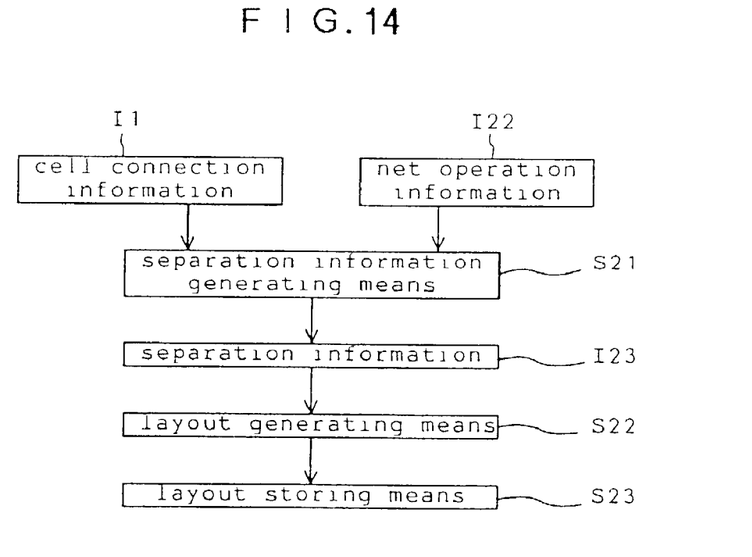
FIG. 14 is an explanatory view explaining an LSI design system according to the third preferred embodiment of the present invention.

This LSI design system, as shown in FIG. 14, includes separation information generating means S21, layout generating means S22 and layout storing means S23. The separation information generating means S21 extracts a pair of wirings which have signal changing points which change at the same time as each other (hereinafter called as 'wirings to be separated') from the cell connection information I1 and wiring operation information I22 included in the cell connection information I1. Then, the separation information I23 which is composed of a pair of extracted wirings to be separated is generated in such a manner that the separation information I23 includes all pairs of wirings which constitute pairs of wirings to be separated.

The layout generating means S22 generates a layout based on the separation information I23 which is generated by the separation information generating means S21.

In this embodiment, the layout is generated in such a manner that no noise occurs between wirings. That is, when the change of signals occurs between neighboring wirings at the same time, a capacitance is generated between the wirings and due to this capacitance, the delay or the acceleration of the signal occurs and hence, noise occurs. Accordingly, in this embodiment, the layout is generated such that the wirings which generate the change of signals at the same time are not arranged close to each other so as to prevent the occurrence of noise. Between neighboring wirings, not only a point of change of signal of the same phase but also a point of change of signal of the anti-phase becomes the cause of noise and hence, irrespective of the phase, a pair of wirings which have the point of change of signal occurring at the same time are set as a pair of wirings to be separated.

Figure 15:
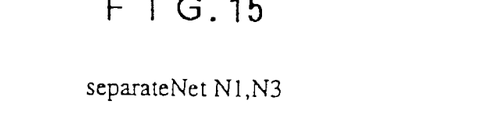
FIG. 15 is an explanatory view illustrating the content of separation information.

Hereinafter, the operation of this embodiment is specifically explained. The cell connection information I1 includes the wiring operation information I22 of three wirings N1, N2, N3 which generate the change of signal as illustrated in FIG. 24 in the same manner as the prior art. In FIG. 24, time is taken on abscissa and symbols {①}, {②}, {③} indicated in the drawing respectively indicate time zones which are divided at given time intervals respectively. In FIG. 24, the wiring N1 and the wiring N2 have the points of change of signal of at the same time and hence the separation information generating means S21 generates the separation information I23 shown in FIG. 15 which sets a combination of the wirings N1, N2 as a pair of wirings to be separated.

Based on the separation information I23, the layout generating means S22 generates a layout which arranges the wirings N1, N2 to be separated included in a pair of wirings to be separated in a spaced-apart manner from each other. That is, the layout generating means S22 generates a layout shown in FIG. 16, for example.

Figure 16:
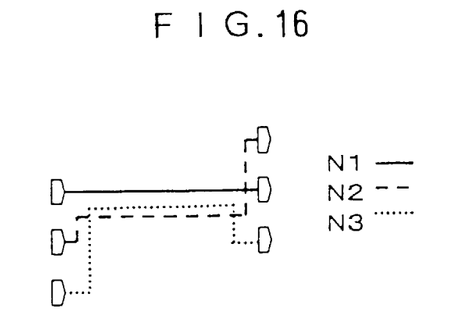
FIG. 16 is an explanatory view illustrating an arrangement condition of wirings which constitutes a generated layout.

As a result, the wirings N1, N2 to be separated are arranged in a spaced-apart manner while sandwiching the wiring N3 which is not a wiring to be separated. In the LSI design system according to this embodiment, even when the wirings N1, N2, N3 are arranged parallel to each other, an advantage that an LSI having the least noise can be developed in a short period is obtained.

In FIG. 24, the wirings N1, N2 to be separated change the signals at the same time not only at the signal change start point but also at the signal change end point. However, it is needless to say that the wirings N1, N2 can be set as wirings to be separated which constitute a pair of wirings to be separated so long as the change of signals is generated at the same time at either one of the signal change start point or the signal change end point. Furthermore, it is needless to say that when the signal change start point of one wiring and the signal change end point of the other wiring take place at the same time, these wirings can be set as wirings to be separated which constitute a pair of wirings to be separated.

Figure 17:
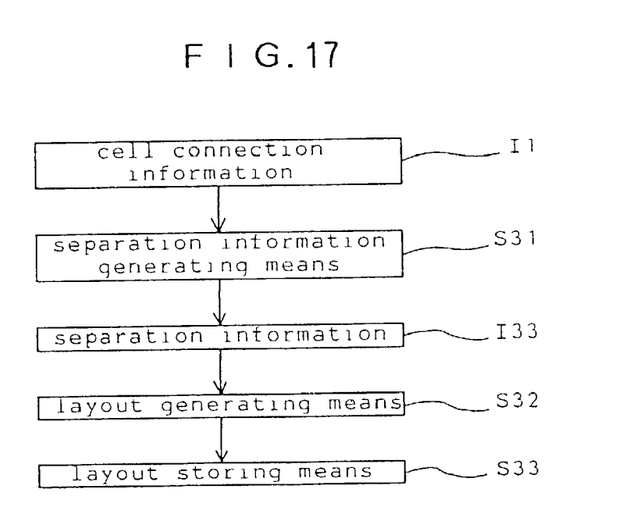
FIG. 17 is an explanatory view explaining an LSI design system according to the fourth preferred embodiment of the present invention.

Subsequently, the fourth preferred embodiment of the present invention is hereinafter explained. As shown in FIG. 17, a LSI design system according to this embodiment includes separation information generating means S31, layout generating means S32 and layout storing means S33. The separation information generating means S31 generates separation information I33 from the cell connection information I1. The layout generating means S32 generates a layout which arranges wirings in a spaced-apart manner based on the separation information I33 generated by the separation information generating means S31.

Among wirings which are included in the cell connection information I1, the separation information generating means S31 sets the wirings having the junction number which is equal to or exceeds a given threshold value as the wirings to be separated. The above-mentioned threshold value is determined based on the average of junction number of the wiring, for example. Usually, the average of the junction number is about 2–3 and hence, it is proper to set the value of the threshold value to about 5–10 which is slightly larger than 2–3. In this embodiment, the junction number 10 is set as the threshold value in view of the experience.

Figure 18:
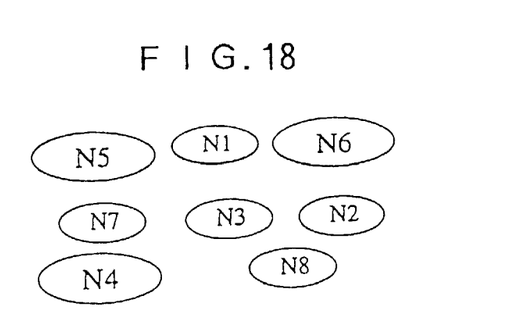
FIG. 18 is an explanatory view illustrating wirings contained in cell connection information.
Figure 19:
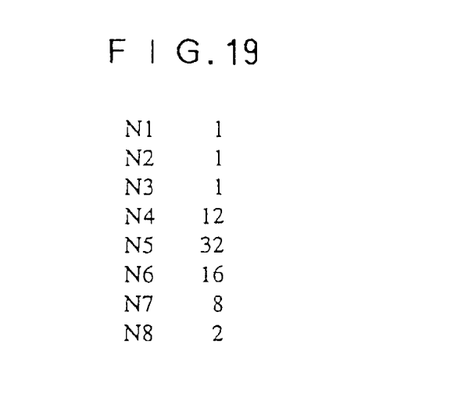
FIG. 19 is an explanatory view explaining numerical examples of junction numbers which respective wirings have.

This embodiment is specifically explained hereinafter in view a case that the cell connection information I1 includes wirings N1–N8 as illustrated in FIG. 18 and the wirings to be separated having the junction number of not less than 10 are set to (N4, N5, N6) as illustrated in FIG. 19, for example.

Figure 20:
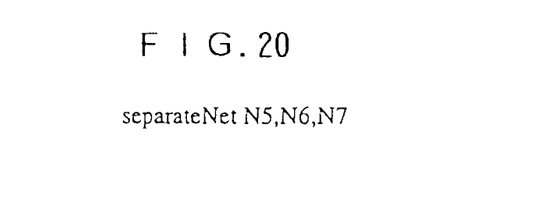
FIG. 20 is an explanatory view explaining the content of separation information.
Figure 21:
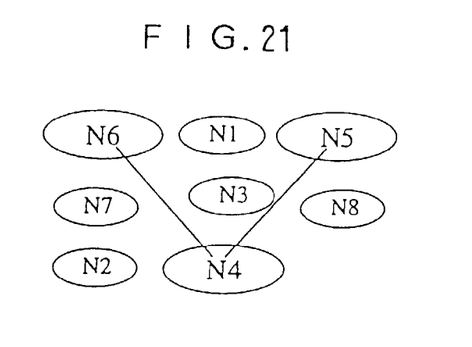
FIG. 21 is an explanatory view illustrating an arrangement condition of wirings which constitutes a generated layout.

In this case, as shown in FIG. 20, the separation information generating means S31 generates the separation information I33 which is composed of the wirings to be separated (N4, N5, N6). The layout generating means S32 arranges these wirings to be separated (N4, N5, N6) in a spaced-apart manner from each other. For example, the layout generating means S32 generates a layout shown in FIG. 21. That is, the layout is generated in such a manner that at least one of wirings N1, N2, N3, N7, N8 which are not included in the wirings to be separated is sandwiched between the wirings to be separated which constitute the wirings to be separated (N4, N5, N6).

This LSI design system obviates the concentrated arrangement of the wirings having a large consumed power and enables the prevention of voltage drop which is caused by a partial power consumption at the time of an initial layout.

The LSI design system of this embodiment is not limited to the above-mentioned construction. The LSI design system also includes a following modification 4 although it is not shown in drawings. The modification 4 is characterized by modifying a portion of the separation information generating means S31. Along with the modification of this separation information generating means S31, the modification 4 differ from the above-mentioned embodiment also in view of the separation information I33 and the layout generating means S32.

Figure 22:
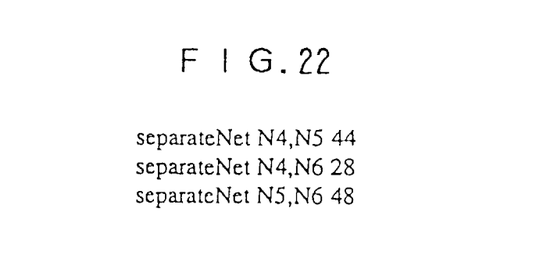
FIG. 22 is an explanatory view illustrating the content of the separation information according to a modification 4.

This modification 4 is explained in view of a wiring arrangement shown in FIG. 18 and FIG. 19 as an example. The separation information generating means S31 of the modification 4 extracts pairs of wirings to be separated (N4, N5), (N4, N6), (N5, N6) which are composed of combinations of the wirings to be separated included in the wirings to be separated (N4, N5, N6) and calculates a combined value of junction numbers of wirings to be separated on every pair of wirings to be separated. Then, the distance which is directly proportional to the junction number combined value is determined as the separate distance information and the separation information I33 which is composed of the pairs of wirings to be separated and the separation distance information is generated. To be more specific, the separation information generating means S31 generates the separation information I33 illustrated in FIG. 22.

The layout generating means S32 generates a layout based on the pairs of wirings to be separated and the separation distance information included in the separation information I33. Accordingly, the layout similar to the layout shown in FIG. 21 can be generated.

As has been described heretofore, respective LSI design systems of the present invention can satisfy the demand for further speedup or further lowering of voltage and the demand for the development in a short period, and furthermore, can prevent the occurrence of noise and voltage drop caused by the concentration of the power consumption at a part. Accordingly, it is no more necessary to rearrange cells or to form a layout of the entire circuit again after generating an initial layout. Furthermore, it is no more necessary to set a wide spacing between wirings so that the high integration of the LSI can be easily realized.

Although the present invention has been explained in detail in view of the most preferred embodiments, the combinations and the arrangements of the components of such preferred embodiments can be altered in various forms without departing from the spirit and the scope of the present invention as claimed later.

What we claim is:

1. An LSI design system comprising:
    signal timing extracting means for extracting a signal having signal data changing points in a predetermined period;
    separation information generating means for extracting a pair of wirings to be separated which have signals extracted by the signal timing extracting means and for generating separation information on said wirings to be separated which are to be spaced apart from each other based on whether the change of signals of respective wirings occurs in a predetermined period; and
    layout generating means for separating the wirings from each other based on said separation information generated by said separation information generating means.

2. The LSI design system according to claim 1, wherein said layout generating means arranges said wirings to be separated such that inter-wiring interference and resulting noise caused by a signal change is prevented.

3. The LSI design system according to claim 2, wherein said wirings to be separated are those wirings which transmit signal changes approximately simultaneously with one another.

4. The LSI design system according to claim 3, wherein said wirings to be separated transmit signals changes at substantially the same time at a signal change start point.

5. The LSI design system according to claim 3, wherein said wirings to be separated transmit signals changes at substantially the same time at a signal change end point.

6. The LSI design system according to claim 3, wherein said wirings to be separated include a wire having a signal change start point which is substantially simultaneous with a signal change end point of a second wire.

7. The LSI design system according to claim 3, wherein said wirings to be separated include wirings which transmit signal changes that are approximately equal in timing but out of phase with one another.

8. The LSI design system according to claim 1, wherein said wirings to be separated are those wirings which transmit signal changes approximately simultaneously with one another.

9. The LSI design system according to claim 2, wherein said wirings to be separated transmit signal changes at substantially the same time at at least one of a signal change start point and a signal change end point.

10. An LSI design system comprising:
    signal timing extracting means for extracting a signal having signal data changing points in a predetermined period;
    separation information generating means for extracting a pair of wirings to be separated which have signals extracted by the signal timing extracting means and for generating separation information on said wirings to be separated from each other based on whether the change of signals of respective wirings occurs in a predetermined period, said separation information generating means identifying wirings which transmit signal changes approximately simultaneously with one another as wirings to be separated from one another in the layout in order to prevent noise therebetween; and
    layout generating means for separating the wirings from each other based on said separation information generated by said separation information generating means.

11. The LSI design system according to claim 10, wherein said layout generating means arranges said layout so that wirings which transmit signal changes approximately simultaneously with one another are spaced from one another.

12. The LSI design system according to claim 11, wherein said layout generating means generates the layout such that at least one wiring which does not require separation is arranged between said wirings to be separated.

13. The LSI design system according to claim 10, wherein said wirings to be separated transmit signal changes at substantially the same time at a signal change start point.

14. The LSI design system according to claim 10, wherein said wirings to be separated transmit signal changes at substantially the same time at a signal change end point.

15. The LSI design system according to claim 10, wherein said wirings to be separated include a wire having a signal change start point which is substantially simultaneous with a signal change end point of a second wire.

16. The LSI design system according to claim 10, wherein said wirings to be separated include wirings which transmit signal changes that are approximately equal in timing but out of phase with one another.

* * * * *